US012000859B2

(12) United States Patent
Sansa Perna et al.

(10) Patent No.: US 12,000,859 B2
(45) Date of Patent: Jun. 4, 2024

(54) RESONANT MICROELECTROMECHANICAL SENSOR WITH IMPROVED OPERATION

(71) Applicant: COMMISSARIAT A L'ENERGIE ATOMIQUE ET AUX ENERGIES ALTERNATIVES, Paris (FR)

(72) Inventors: Marc Sansa Perna, Grenoble (FR); Théo Miani, Grenoble (FR); Thierry Verdot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/929,872

(22) Filed: Sep. 6, 2022

(65) Prior Publication Data

US 2023/0072687 A1    Mar. 9, 2023

(30) Foreign Application Priority Data

Sep. 9, 2021 (FR) .................................. 21 09455

(51) Int. Cl.
G01P 15/097 (2006.01)
G01P 15/08 (2006.01)
H03H 9/02 (2006.01)

(52) U.S. Cl.
CPC ....... G01P 15/097 (2013.01); H03H 9/02362 (2013.01); G01P 2015/0814 (2013.01);
(Continued)

(58) Field of Classification Search
CPC .......... G01P 15/097; G01P 2015/0882; G01P 2015/0814; G01P 2015/0851; H03H 9/02362

See application file for complete search history.

(56) References Cited

U.S. PATENT DOCUMENTS 5,969,249 A * 10/1999 Roessig .............. G01P 15/0802
73/514.36
2002/0125791 A1* 9/2002 Blake ...................... G01L 1/106
310/311

(Continued)

FOREIGN PATENT DOCUMENTS

CN        110780089 A    2/2020
JP        110780089    *  2/2020

OTHER PUBLICATIONS

Translation of CN110780089.*

(Continued)

Primary Examiner — Helen C Kwok
(74) Attorney, Agent, or Firm — Oblon, McClelland, Maier & Neustadt, L.L.P.

(57) ABSTRACT

A resonant sensor including a support, a proof body suspended from the support and having a resonant frequency ωa, an element that measures a force including at least one resonator of resonant frequency $\omega_m$, the force being applied by the proof body, and a mechanical decoupling structure interposed between the proof body and the resonator. The decoupling structure includes a decoupling mass, a first connecting element between the decoupling mass and the proof body, a second connecting element between the decoupling mass and the resonator, the decoupling structure having a main vibration mode whose resonant frequency $\omega_d$ is such that $\omega a<\omega_d<\omega_m$, the decoupling structure forming a mechanical low-pass filter between the proof body and the resonator.

12 Claims, 2 Drawing Sheets

(52) U.S. Cl.
CPC ............... *G01P 2015/0851* (2013.01); *G01P 2015/0882* (2013.01)

(56) References Cited

U.S. PATENT DOCUMENTS

| | | | | |
|---|---|---|---|---|
| 2004/0226371 | A1* | 11/2004 | Baudry | G01P 15/097 73/504.12 |
| 2007/0163347 | A1* | 7/2007 | Le Traon | G01P 15/097 257/414 |
| 2011/0056294 | A1* | 3/2011 | Simoni | G01P 15/10 73/514.29 |
| 2013/0298675 | A1* | 11/2013 | Thiruvenkatanathan | G01P 15/18 73/504.16 |
| 2014/0305208 | A1* | 10/2014 | Thiruvenkatanathan | G01C 19/5712 73/504.12 |
| 2015/0226762 | A1* | 8/2015 | Seshia | G01K 11/26 73/495 |
| 2020/0124634 | A1* | 4/2020 | Seshia | G01P 21/00 |
| 2020/0166537 | A1* | 5/2020 | Zou | G01P 15/0802 |
| 2021/0270608 | A1* | 9/2021 | Zhou | G01P 15/097 |

OTHER PUBLICATIONS

French Preliminary Search Report dated May 13, 2022 in French Application 21 09455 filed on Sep. 9, 2021 (with English Translation of Categories of Cited Documents), citing documents 1-2, 15 & 24 therein, 2 pages.

Li et al. "Bridged Micromechanical Filters", Frequency Control Symposium and Exposition, 2004 Proceedings of the 2004 IEEE International, Aug. 23, 2004, 7 Pages.

* cited by examiner

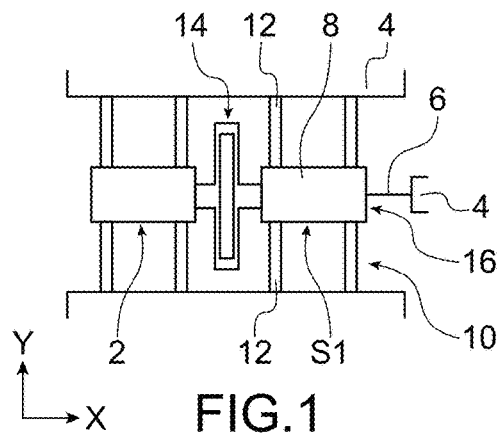
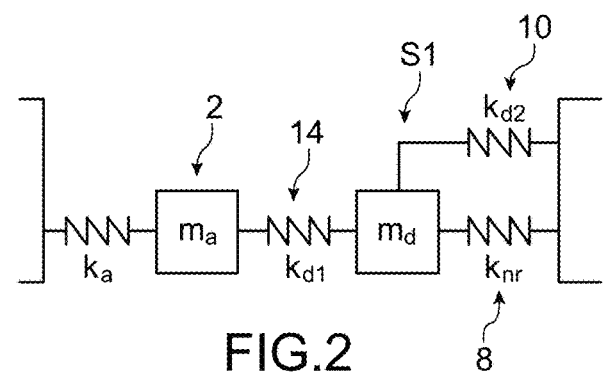
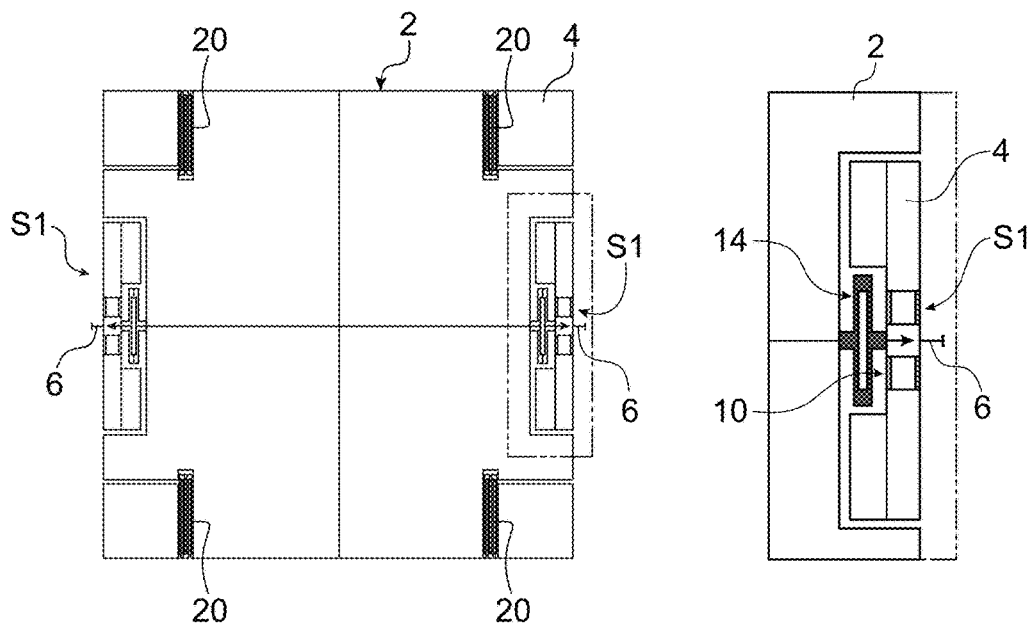

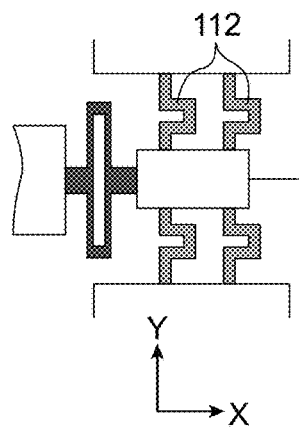
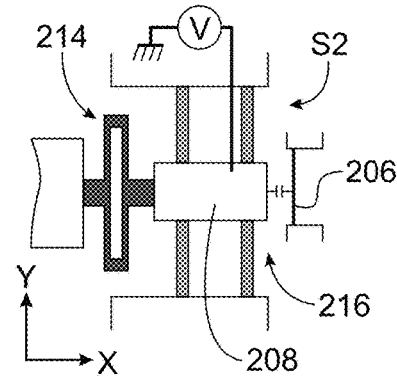
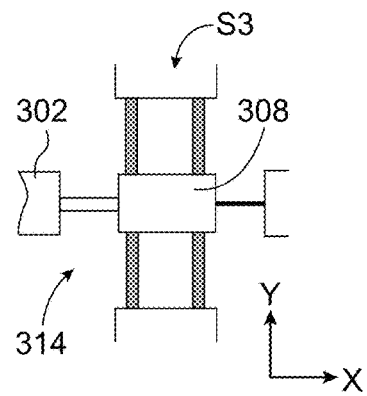
FIG.4A    FIG.4B    FIG.4C
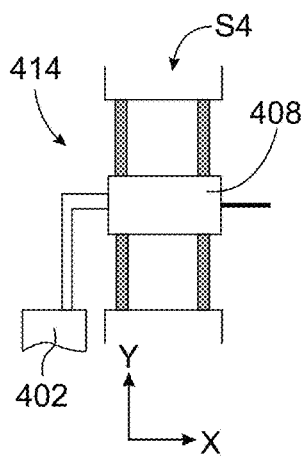
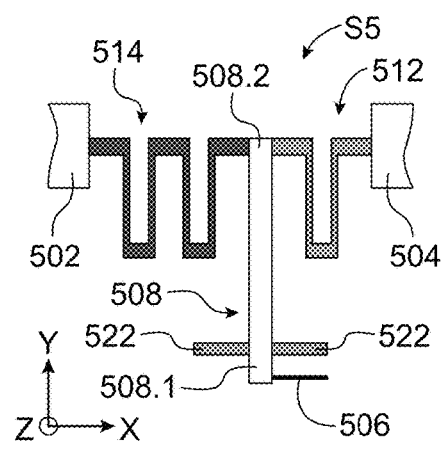
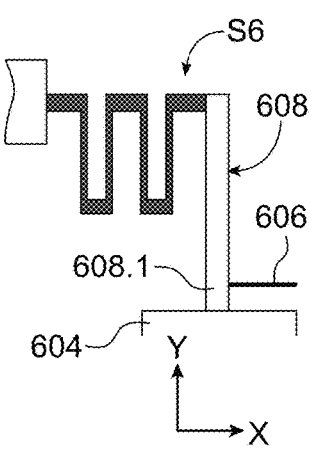
FIG.4D    FIG.4E    FIG.4F
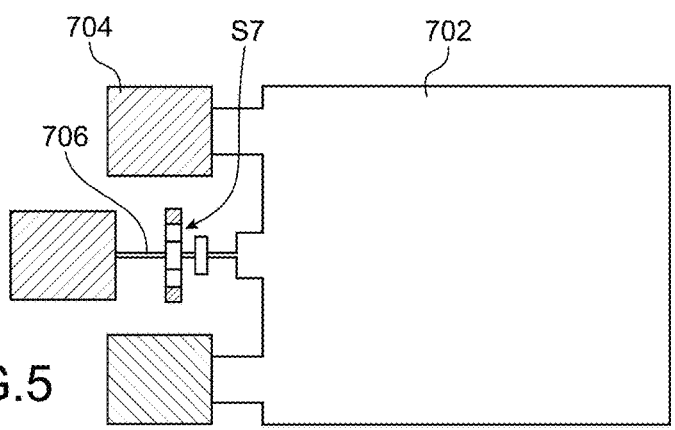
FIG.5

RESONANT MICROELECTROMECHANICAL SENSOR WITH IMPROVED OPERATION

TECHNICAL FIELD AND PRIOR ART

The present invention relates to a resonant microelectromechanical sensor with improved operation.

A resonant sensor measures a physical quantity by virtue of its effect on a resonant element or resonator. The natural frequency or resonant frequency of the resonator depends on the value of the physical quantity to be measured.

A resonant accelerometer is one example of such a sensor. A resonant accelerometer is one example of a resonant sensor including a mass suspended from a support and movable under the effect of an acceleration and at least one resonator suspended between the support and the mass. The resonator is for example formed by a vibrating beam, i.e. a beam vibrated at its resonant frequency by electrodes. When the mass moves under the effect of an acceleration, the beam which is mechanically integral with the mass is compressed or stretched, which modifies its apparent flexural stiffness, and consequently its resonant frequency. The change in its resonant frequency is detected, allowing the value of the acceleration to be deduced. The resonant beam is used as a force sensor.

Accelerometers manufactured using MEMS&NEMS (Microelectromechanical systems & Nanoelectromechanical systems) technology include a mass with micrometric dimensions, i.e. a footprint of some 100 µm to a few mm on each side, for example formed by a square of 1000 µm. The thickness of the mass can be up to 700 µm due to the thickness of the substrate, and one or more resonant beams or resonators of nanometric dimensions, called nanoresonators. The nanoresonators are beams whose dimensions can be as follows: a length of a few µm to a few tens of µm and a nanometric cross-section area of a few tens of nm to 1 µm on each side.

By miniaturising the beams in relation to the mass, it is possible to achieve a much higher acceleration sensitivity than that achieved by accelerometers including a seismic mass and micrometer-sized beams.

The resonant frequency of the nano-sized beams is in the order of several MHz, and the resonant frequency of the fundamental mode of the micrometer-sized seismic mass is in the order of a few kHz.

This considerable difference between the resonant frequencies of the seismic mass and the nanoresonator raises a number of problems. Due to its dimensions, the suspended seismic mass has a large number of resonant modes with a mode density that increases as the mode order increases and their natural frequency deviates from the fundamental mode frequency. More specifically, a seismic mass with a fundamental mode in the order of one kHz has a significant density of modes at the resonant frequency of the nanoresonator in the order of one MHz; hereafter, the resonant modes of the suspended seismic mass other than its fundamental mode will be referred to as "spurious modes". The characteristic properties of these modes (frequency and modal distortion) generally vary very little with acceleration. In contrast, the resonant frequency of the nanoresonator varies with acceleration, and will therefore be made to "sweep" some range of frequencies during its operation; hereafter this range of frequencies will be called the "nanoresonator frequency range". Consequently, during the operation of the sensor, the resonant frequency of the nanoresonator crosses that of one spurious mode, leading in some cases to a phenomenon of mode coupling. In practice, both resonance modes will interact with each other and the acceleration information contained in the nanoresonator frequency will be lost. The sensor may then be rendered "blind" in some frequency ranges, or even result in the readout electronics of the nanoresonator being unlocked. The readout electronics typically implement a phase-locked loop; when a spurious mode crosses the resonance mode of the resonator, the loop is out of adjustment.

In order to avoid that the resonant frequency of the nanoresonator crosses the frequency of one of the modes of the seismic mass, the frequency range of the nanoresonator can be limited to frequencies that are not those of the spurious modes. However, this results in limiting the range of measurable accelerations, thereby degrading the dynamic range of the sensor.

DISCLOSURE OF THE INVENTION

One purpose of the present invention is therefore to provide a resonant sensor that does not have the above drawbacks and has a wide dynamic range.

The above stated purpose is achieved by a resonant sensor including a movable proof body and at least one resonator arranged one with respect to the other so that displacement of the proof body causes a variation in the stress in the resonator, said sensor also including mechanical decoupling means between the proof body and the resonator so that the movement of the resonator at its resonant frequency in its frequency range in the order of one MHz or a few MHz cannot actuate spurious modes of the proof body. Therefore, this avoids that the resonant frequency of the resonator crosses the frequency of one of the modes of the seismic mass.

In other words, coupling between the resonance modes of the resonator and the spurious modes of the proof body is prevented. The decoupling means have a low-pass filter function which allows transmission of low frequency forces in the order of one kHz or a few kHz from the proof body to the resonator and prevents transmission of high frequency forces in the order of one MHz or a few MHz from the resonator to the proof body.

The movement of the resonator thereby cannot actuate the spurious modes. Furthermore, if the spurious modes were excited by another effect, such as a vibration at its resonant frequency or a shock, this excitation would not interfere with the operation of the resonator.

The decoupling means are for example formed by a mechanical structure whose resonant frequency is between the resonant frequency of the accelerometer and the resonant frequency of the resonator and advantageously whose resonant frequency is less than 10 times the resonator frequency. Thus, forces transmitted between the proof body and the nanoresonator are at frequencies lower than that of the decoupling means and are not likely to achieve coupling, causing a malfunction of the sensor.

For example, the decoupling means include a suspended mass, the mass being connected on the one hand to the resonator and on the other hand to the proof body via a spring. The mass and the spring of the decoupling means are chosen to have the resonant frequency adapted.

One of the objects of the present application is a resonant sensor including a support, a proof body suspended with respect to the support and having a resonant frequency $\omega a$, means for measuring a force including at least one resonator of resonant frequency $\omega_{rn}$, said force being applied by the proof body, and a mechanical decoupling structure interposed between the proof body and the resonator, said decoupling structure including a decoupling mass, a first connecting element between the decoupling mass and the proof body, a second connecting element between the decoupling mass and the resonator, the decoupling structure having a main vibration mode whose resonant frequency $\omega_d$ is such that $\omega a < \omega_d < \omega_m$, said mechanical decoupling structure forming a mechanical low pass filter between the proof body and the resonator.

Preferably $\omega_d < 10 \times \omega_m$.

For example, the first connecting element has a stiffness $k_{d1}$, the proof body is suspended from the support by suspension means having a stiffness $k_a$ and the ratio $k_a/k_{d1}$ is between 1 and 100.

In one exemplary embodiment, the resonator is directly anchored to the proof body and the first connecting element includes a spring.

The decoupling mass may be in the form of a beam that is rotatably hinged relative to the support about a direction normal to a plane of the sensor.

For example, the decoupling mass is directly anchored to the support through a longitudinal end.

In another exemplary embodiment, the decoupling structure includes means for suspension from the support.

According to an additional characteristic, the proof body and the decoupling structure have a thickness of one or more tens of µm and the resonator has a cross-section area in the order of a few hundred nm on each side.

The resonant sensor may include means for modifying stiffness of the first connecting element, and/or means for modifying stiffness of the second connecting element and/or means for modifying stiffness of the means for suspending the decoupling structure from the support.

For example, the resonant sensor includes at least a first layer and a second layer, the first layer having a thickness of one or more tens of µm and the second layer having a thickness of a few hundred nm. The proof body and the decoupling structure are made in the first layer, and the decoupling structure includes a third layer made of a different material than that of the first layer.

Advantageously, the resonant sensor includes two differentially mounted resonators, each resonator being connected to the proof body through a decoupling structure.

The resonant sensor may form a resonant accelerometer, in which the proof body is a seismic mass.

BRIEF DESCRIPTION OF THE DRAWINGS

The present invention will be better understood based on the following description and the appended drawings in which:

FIG. 1 is a schematic representation of a resonance accelerometer according to the invention.

FIG. 2 is a representation of the mechanical model of the resonant accelerometer of FIG. 1.

FIG. 3 is a top view of a practical embodiment of an accelerometer according to FIG. 1 implementing a differential measurement.

FIGS. 4A to 4F are schematic representations of decoupling means according to other exemplary embodiments.

FIG. 5 is a schematic representation of a resonant sensor according to the invention in which the proof body is movable in an out-of-plane direction.

DETAILED DESCRIPTION OF PARTICULAR EMBODIMENTS

In FIG. 1, a schematic representation of an example of an accelerometer according to the invention including a seismic mass 2 suspended from a support 4 or substrate and movable in the sensor plane relative to the support van be seen. The plane of the sensor is considered to be parallel to the support and forms a mean plane for the mass parallel to the larger faces of the mass. In the example represented, the mass 2 is movable along the X direction.

The accelerometer includes a resonator 6 formed by a beam with a nanometric cross-section, hereinafter referred to as a nanoresonator, which has a cross-section area much smaller than that of the mass and the springs, ideally more than an order of magnitude smaller than the cross-section area of the springs. The cross-section area of the nanoresonator is for example between a few tens of nm to 1 µm on each side, for example the cross-section area can be between 25 nm×25 nm and 2 µm×2 µm. The nanoresonator is suspended through a first longitudinal end from the support 4 and through a second longitudinal end from the seismic mass 2 via decoupling means. The nanoresonator 6 extends along the X direction so that it is compressed or stretched upon moving the mass. The Y direction is contained in the plane and is orthogonal to the X direction.

The decoupling means hereinafter referred to as the "decoupling structure" S1 comprises a decoupling mass 8 suspended from the support through suspension means 10. In the example represented, the suspension means 10 includes two pairs of parallel beams 12, the beams 12 of each pair extending on either side of the decoupling mass 8 with respect to the X direction and along the Y direction. The decoupling mass 8 can then move in the X direction, with the beams 12 flexurally deforming.

The decoupling means also includes a first connecting element 14 connecting the decoupling mass 8 to the seismic mass 2, and a second connecting element 16 connecting the decoupling mass 8 and the nanoresonator 6.

In this example, the nanoresonator 6 is directly anchored to the decoupling mass 8 of the decoupling structure S1, so the second connecting element 16 can be considered rigid. The first connecting element 14 implemented is such that it is capable of elastic deformation and performs the function of a force-transmitting spring between the seismic mass 2 and the nanoresonator. In this example, the first connecting element 14 includes a rectangular-shaped frame 18, with the seismic mass 2 being directly connected to one long side 18.1 and the decoupling mass 8 being connected to the other long side 18.2, the long sides being capable of deformation in the X direction. This exemplary embodiment is not exclusive of other forms which will be described below.

In FIG. 2, a mechanical model of the accelerometer of FIG. 1 can be seen.

The suspended seismic mass 2 has a mass, the suspension means of the mass 2 are modelled by a spring $R_a$ having a stiffness k a between the mass 2 and the support. The nanoresonator is modelled by a spring $R_{nr}$ having a stiffness $k_{nr}$. The decoupling mass 8 has a mass $m_d$, the suspension means of the decoupling mass 8 is modelled by a spring $R_{d2}$ having a stiffness $k_{d2}$ between the decoupling mass 8 and the support 4 and the first connecting element 14 is modelled by a spring $R_{d1}$ having a stiffness $k_{d1}$ between the decoupling mass 8 and the seismic mass 2.

The decoupling structure acts as a resonator and filters frequencies above its resonant frequency $\omega_d$. From the model in FIG. 2, this resonant frequency can be calculated as:

$$\omega_d^2 = \frac{k_{d2} + k_{d1} + k_{nr}}{m_d}$$

The characteristics of the decoupling structure are chosen so that it transmits the low-frequency signals of the acceleration to be measured and actually filters spurious modes whose high frequencies may couple with the resonance mode of the nanoresonator. For this, the decoupling structure is made such that:

$$\omega_a < \omega_d < \omega_{nr}$$

With $\omega_a$ the natural frequency of the accelerometer and $\omega_{nr}$ the natural frequency of the nanoresonator.

Preferably, 10 $\omega_d < \omega_{nr}$ is chosen.

Furthermore, the transfer function of the resonant accelerometer is given by the relationship between acceleration and stress applied to the nanoresonator designated $\sigma_{nr}$ and considering that the resonant frequency of the nanoresonator is proportional to its stress.

The transfer function can be written as:

$$\frac{\sigma_{nr}}{a} = \frac{m_a}{S_{nr}} \left[ \frac{k_{nr}}{k_{nr} + k_{d2}} \right] \left[ \frac{k_{d1}}{k_a + k_{d1}} \right]$$

With $S_{nr}$ being the transverse cross-section area of the nanoresonator.

If it is considered that the beams 12 of the decoupling structure have only a stability function, the stiffness $k_{d2}$ of the set of beams 12 is negligible in comparison with the stiffness $k_{nr}$ of the nanoresonator, the transfer function can be approximated to:

$$\frac{\sigma_{nr}}{a} \cong \frac{m_a}{S_{nr}} \left[ \frac{k_{d1}}{k_a + k_{d1}} \right]$$

It is noticed that the sensitivity of the resonant accelerometer is set by the ratio between stiffnesses $k_{d1}$ and $k_a$. Preferably, the values of these stiffnesses are chosen so that the accelerometer has a high sensitivity. The ratio $K_a/k_{d1}$ is advantageously less than 100 and preferably equal to or close to 1.

The resonant coupling structure may have resonance modes other than its main resonance mode at frequency $\omega_d$, which may interfere with the operating range of the nanoresonator and thus disturb operation of the accelerometer. The dimensioning of the different parts of the decoupling structure allows these interfering modes to be set so that they are outside the operating frequency range of the nanoresonator.

By way of example only, dimensioning of the decoupling structure and the resonant frequency values of its spurious modes will be given. The decoupling structure is the one shown in FIG. 1.

The seismic mass 2 and its suspension means are made in a 20 m thick Si layer; and the nanoresonator is made in a thinner layer of 0.25 m thickness.

The in-plane dimensions of the mass can be between 20 μm×20 μm and 50 μm×50 μm.

The nanoresonator has a cross-section area of 250×250 nm² and a length of 10 μm, which has a nanoresonator frequency range of 10 MHz-20 MHz during its operation as a sensor.

The decoupling structure is made in the 20 μm silicon layer with the following dimensions:

The square-shaped decoupling mass has sides of length $L_{m2}$=20 μm and a mass $m_2$.

The length of the beams 12 is $L_{f2}$=20 μm is the length of the elements, and their width is $w_{f2}$=1 μm.

The first connecting element 14 includes two arms of length $L_{c1}$=50 μm and width $w_{c1}$=1 μm, connected at their ends by square masses of side length $L_{mc1}$=5 μm and mass $m_{c1}$.

The filtering resonant frequency $\omega_d$ is 1.7 MHz. The decoupling structure has spurious frequencies of 0.5 MHz and 22 MHz. These frequencies do not interfere with the operating range of 10 MHz-20 MHz for the nanoresonator.

In FIG. 3, a practical example of a resonant accelerometer implementing the decoupling structure S1 can be seen.

The accelerometer includes two differentially-mounted nanoresonators 6, each nanoresonator being connected to the seismic mass 2 via the decoupling structure S1. The seismic mass is suspended from the support by four U-shaped springs 20. These four springs are modelled by the spring having a stiffness ka in the model in FIG. 2.

In the example represented, the decoupling mass 8 of the decoupling structure S1 is suspended through four beams 12. According to another example represented in FIG. 4A, the decoupling mass 108 is suspended through more flexible supports 112 than the beams 12, for example U-shaped or Z-shaped supports. Further, more or less than four supports may be implemented.

Still alternatively, no support is implemented and the decoupling mass 8 is suspended through its connection to the accelerometer mass and through its connection to the nanoresonator.

Further, in another exemplary embodiment, the nanoresonator is not directly anchored to the decoupling mass, and the second connecting element 16 between the mass of the decoupling means and the nanoresonator may have some flexibility and for example be similar to the first connecting element 14 of FIG. 1.

In FIG. 4B, another exemplary embodiment of a decoupling structure S2 can be seen, in which the connection 216 between the nanoresonator 206 and the decoupling structure is not mechanical but electrostatic. The decoupling structure and the nanoresonator are then configured to have a strong capacitive coupling therebetween. In this example, the nanoresonator 206 is oriented orthogonally to the axis X and in parallel to and facing a face of the decoupling mass 208. Thus, by applying a potential difference between the mass 208 and the nanoresonator 206, a capacitive coupling between the nanoresonator 206 and the face of the mass 208 is generated. This coupling ensures stress transmission from the seismic mass 202 to the nanoresonator 206. Furthermore, it allows the nanoresonator to be prestressed. The connecting element 214 between the seismic mass 202 and the decoupling mass 28 may be replaced with an electrostatic connection.

According to another exemplary embodiment of a decoupling structure S3 represented in FIG. 4C, the first connecting element 314 between the decoupling mass 308 and the seismic mass 302 is formed by a beam having a higher stiffness than the first connecting element 14 of FIG. 1. Nevertheless, such a beam has some flexibility that has to be taken into account in modelling the decoupling structure. This example has the advantage of reducing signal losses in comparison with a more flexible connecting element.

In a MEMS&NEMS system, for example a resonant accelerometer, the seismic mass of the accelerometer is made in a thick material layer, for example of silicon, for example 20 μm thick and the nanoresonator is made in a much thinner material layer, for example of silicon nitride, for example 0.25 μm thick. Preferably, the decoupling structure can be made in the thick layer as the seismic mass and have the same thickness. A decoupling structure made in the much thinner layer does not depart from the scope of the invention, however, it may have a significant number of spurious modes at the nanoresonator frequency.

Preferably, the seismic mass has larger in-plane dimensions than the decoupling structure to limit the occurrence of spurious modes of the decoupling means in the frequency range of the nanoresonator. Preferably, the surface area of the seismic mass is at least 10 times larger than that of the decoupling structure.

Alternatively, the decoupling structure is made in the thick layer, and is then thinned to a thickness intermediate between the thickness of the seismic mass and the nanoresonator. This may allow more freedom to set the resonant frequency of the decoupling structure and increase the sensitivity of the sensor in comparison with an unthinned structure.

In one exemplary embodiment, the decoupling structure and the seismic mass may be made of the same material, for example silicon. A layer of a different material may be deposited on the decoupling structure for altering mechanical properties of the decoupling structure, for example stiffnesses of the connecting and suspension elements.

In another example, the decoupling structure is made of a different material than the seismic mass which allows, while keeping the same dimensions of the decoupling structure, a decoupling mass with a larger or smaller mass and/or more or less rigid connecting and/or suspension elements. Making the decoupling structure in a different material may for example include etching the MEMS layer, depositing, for example by sputtering, a selective material onto the desired zone for forming the decoupling structure and then depositing the decoupling structure material onto the desired zone.

In another example, the decoupling structure is made in the layer in which the nanoresonator is made.

This example allows more flexible supports and a more flexible second connecting element 16 to be made due to their smaller dimensions. Furthermore, the decoupling mass 8 has a reduced mass.

This may also allow for more freedom in setting the resonant frequency of the decoupling structure.

In FIG. 4D, another exemplary embodiment of a decoupling structure S4 can be seen, wherein the first connecting element 414 between the seismic mass 402 and the decoupling mass 408 includes a beam oriented along the Y-direction, along which the nanoresonator 406 is aligned, the beam is embedded through one end to the seismic mass and through another end to the decoupling mass 408. The beam has flexibility in the X direction and is rigid in the Y direction. More generally, the connecting element 414 is flexible in a direction orthogonal to the axis of the nanoresonator and rigid in the axis of the nanoresonator allowing greater freedom in the relative arrangement of the seismic mass and the decoupling structure.

In FIG. 4E, a further exemplary embodiment of a decoupling structure S5 can be seen, in which the decoupling mass 508 includes a beam suspended from the support so as to be rotatably movable in the X-Y plane. In this example, the decoupling mass 508 extends along the Y direction and the nanoresonator 506 is anchored to a longitudinal end 508.1 of the decoupling mass 508. The seismic mass 502 is connected to the other longitudinal end 508.2 of the decoupling mass 508 through a serpentine-shaped connecting element 514. Two beams 522 aligned along the Y-direction and anchored to the decoupling mass 508 in proximity to the end 508.1 form a pivot connection. For example, serpentine-shaped suspension means 512 suspend the decoupling mass 508 from the support 504 at the end 508.2. In this example, the decoupling mass does not deform during operation of the accelerometer.

In FIG. 4F, another exemplary embodiment of a decoupling structure S6 can be seen, which differs from structure S5 in FIG. 4E, in that the decoupling mass 608 is directly anchored to the support 604 by its end 608.1 and flexurally deforms during operation of the accelerometer. The nanoresonator 606 is anchored to the beam at its end 608.1. In this example, a support 604 for the decoupling mass 608 is not required, as the anchoring of the decoupling mass 608 provides support.

In one advantageous embodiment, the decoupling structure is such that it allows adjustment of its resonant frequency and possibly of the spurious modes of the decoupling structure. The structure has means for modifying stiffness of the first connecting element between the decoupling mass and the seismic mass, and/or stiffness of the second connecting element between the decoupling mass and the nanoresonator, and/or the stiffness of the means for suspending the decoupling mass from the support. Such an adjustment of the decoupling structure allows a resonant sensor with several operating ranges to be made.

For example, the stiffness adjustment means may be of the piezoelectric type. For example, the connecting elements and/or the suspension elements include a layer of piezoelectric material, and the rigidity of these elements can be modified by choosing intensity of the electric current flowing in this layer. The stiffness of each element can be adjusted separately. This adjustment can be made at the factory, thereby making a single sensor structure that is then adapted to different applications, or it can be made during operation of the accelerometer depending on external conditions. Alternatively, the adjustment means are, in a non-limiting way, of the thermal/thermoelectric or electrostatic type.

The present invention is also applicable to a resonant sensor in which the proof body 702 is movable in an out-of-plane direction relative to the support 704 as depicted in FIG. 5. The decoupling structure S7 is for example disposed between the resonator 706 and the proof body 702.

The resonant sensor according to the invention is manufactured using micro&nanomicroelectromechanical systems (M&NEMS) manufacturing techniques.

For example, it can be manufactured using the method described in document WO201148138.

The present invention is particularly adapted to the production of resonant accelerometers, allowing to obtain a relatively high dynamic range and a relatively wide frequency range.

The invention can be applied to making other resonant sensors, such as resonant force sensors, as for example pressure sensors, flow meters, magnetometers. The invention is especially advantageous in the case of sensors with a very wide dynamic range, which implies a wide frequency range of the nanoresonator, and consequently a high probability of having spurious modes present in this range.

The invention claimed is:

1. A resonant sensor, comprising:
   a support,
   a proof body suspended from the support and having a resonant frequency $\omega a$, means for measuring a force including at least one resonator of resonant frequency $\omega_{rn}$, said force being applied by the proof body, and
   a mechanical decoupling structure interposed between the proof body and the resonator, said decoupling structure including a decoupling mass, a first connecting element between the decoupling mass and the proof body, a second connecting element between the decoupling mass and the resonator, the decoupling structure having a main vibration mode whose resonant frequency $\omega_d$ is such that $\omega a < \omega_d < \omega_{rn}$, said mechanical decoupling structure forming a mechanical low-pass filter between the proof body and the resonator.

2. The resonant sensor according to claim 1, wherein $\omega_d < 10 \times \omega rn$.

3. The resonant sensor according to claim 1, wherein the first connecting element has a stiffness kd1, wherein the proof body is suspended from the support by a suspension mechanism having a stiffness $k_a$ and wherein the ratio $k_a/k_{d1}$ is between 1 and 100.

4. The resonant sensor according to claim 1, wherein the resonator is directly anchored to the proof body and the first connecting element includes a spring.

5. The resonant sensor according to claim 1, wherein the decoupling mass is in the form of a beam which is rotatably hinged relative to the support about a direction normal to a plane of the sensor.

6. The resonant sensor according to claim 5, wherein the decoupling mass is directly anchored to the support through a longitudinal end.

7. The resonant sensor according to claim 1, wherein the decoupling structure includes means for suspending from the support.

8. The resonant sensor according to claim 1, wherein the proof body and the decoupling structure have a thickness of one or more tens of μm and the resonator has a cross-section area in the order of a few hundred nm on each side.

9. The resonant sensor according to claim 1, including means for modifying stiffness of the first connecting element, and/or means for modifying stiffness of the second connecting element and/or means for modifying stiffness of a means for suspending the decoupling structure from the support.

10. The resonant sensor according to claim 1, comprising at least a first layer and a second layer, the first layer having a thickness of one or more tens of μm and the second layer having a thickness of a few hundred nm on each side, wherein the proof body and the decoupling structure are made in the first layer and wherein the decoupling structure includes a third layer of a material different from that of the first layer.

11. The resonant sensor according to claim 1, including two differentially-mounted resonators, each resonator being connected to the proof body through a decoupling structure.

12. The resonant sensor according to claim 1, forming a resonant accelerometer, wherein the proof body is a seismic mass.

* * * * *